(12) United States Patent
Su et al.

(10) Patent No.: US 8,852,995 B1
(45) Date of Patent: Oct. 7, 2014

(54) PREPARATION METHOD FOR PATTERNIZATION OF METAL ELECTRODES IN SILICON SOLAR CELLS

(71) Applicant: Atomic Energy Council—Institute of Nuclear Energy Research, Taoyuan County (TW)

(72) Inventors: Yu-Han Su, Taoyuan County (TW); Tsun-Neng Yang, Taoyuan County (TW); Wei-Yang Ma, Taoyuan County (TW); Chien-Chang Chao, Taoyuan County (TW); Shan-Ming Lan, Taoyuan County (TW)

(73) Assignee: Atomic Energy Council-Institute of Nuclear Energy Research, Taoyuan County (TW)

( * ) Notice: Subject to any disclaimer, the term of this patent is extended or adjusted under 35 U.S.C. 154(b) by 0 days.

(21) Appl. No.: 13/959,835

(22) Filed: Aug. 6, 2013

(51) Int. Cl.
*H01L 21/00* (2006.01)
*H01L 31/028* (2006.01)
*H01L 31/068* (2012.01)
*H01L 31/0224* (2006.01)

(52) U.S. Cl.
CPC ...... *H01L 31/022441* (2013.01); *H01L 31/028* (2013.01); *H01L 31/068* (2013.01)
USPC .......................................................... 438/98

(58) Field of Classification Search
USPC .......................................................... 438/98
See application file for complete search history.

(56) References Cited

U.S. PATENT DOCUMENTS

| | | | |
|---|---|---|---|
| 2013/0068954 A1* | 3/2013 | Chan ........................ | 250/370.01 |
| 2013/0213469 A1* | 8/2013 | Kramer et al. ................ | 136/256 |
| 2013/0255770 A1* | 10/2013 | Carroll et al. ................ | 136/256 |
| 2014/0124027 A1* | 5/2014 | Teshima et al. ............... | 136/256 |

OTHER PUBLICATIONS

Raval, Mehul C. "Review of Ni-Cu Based Front Side Metallization for c-Si Solar Cells," Journal of Solar Energy, vol. 2013, 20 pages, Oct. 2013.*

* cited by examiner

*Primary Examiner* — Yu-Hsi D Sun
*Assistant Examiner* — Grant Withers
(74) *Attorney, Agent, or Firm* — Rosenberg, Klein & Lee

(57) ABSTRACT

The present invention relates to a preparation method for patternization of metal electrodes in silicon solar cells. After disposing an amorphous silicon layer on a silicon substrate processed by diffusion, laser light is projected on the amorphous silicon layer for patternization, and transforming the amorphous silicon with low optical conductivity into polysilicon with high optical conductivity thanks to the recrystallization process of the laser light. Then, after immersing the amorphous silicon layer in plating liquid, metal electrode can be formed accurately at the spots of the amorphous silicon layer patterned by laser light. No external voltage is required; plating reaction is induced by illumination directly.

7 Claims, 3 Drawing Sheets

PREPARATION METHOD FOR PATTERNIZATION OF METAL ELECTRODES IN SILICON SOLAR CELLS

FIELD OF THE INVENTION

The present invention relates generally to a preparation method for patternization of metal electrodes in silicon solar cells, and particularly to a preparation method for patternization of metal electrodes in silicon solar cells which uses laser beams to patternize an amorphous silicon layer beforehand for forming electrode patterns so that metal electrodes can be formed on the electrode patterns during plating.

BACKGROUND OF THE INVENTION

The research of solar cells is an anticipated direction for renewable energy sources. During the power generating process of solar cells, no greenhouse gas or pollutant gas, such as carbon diode, nitrogen oxides, and sulfur oxides, will be generated. Instead, the photoelectric effect is applied for converting solar energy into electric energy directly, endowing solar cells with technical advantages of not consuming non-renewable resources. In the 21st century of running-out resources and rising prices of energy sources, solar cells are valued substantially.

Nonetheless, how to make solar energy a stable and sustainable energy source for humans is still a challenge. For current power generating technology using solar energy, there still exist many places for improvement, including stability, lifetime, or costs.

Among the types of solar cells, silicon solar cells are developed earlier and their energy conversion efficiency is higher. They can be further divided into single-crystalline and poly-crystalline types. Generally, silicon solar cells adopt p-type silicon with impurity doping as the substrate. Then an n-type region layer is fabricated on its surface for forming p-n junctions.

The mainstream of producing front-grid electrode of silicon solar cells is through screen printing silvers; however, the ITRPV roadmap predicted that silver electrode would replaced by copper plated electrode since the cost of former is high. The Ni/Cu electrode is attractive; here, the main function of the nickel is used as a buffer layer between the silicon substrate and the copper, which prevents the decreasing of lifetime of solar cell by stopping the copper diffuses to the silicon substrate. At the same time, there is low specific contact resistance nickel where the nickel contacts the silicon substrate. However, Ni/Cu electrode is still not gain favor by industry. The reason is that the process of patternization of front-grid electrode is complicated. That is, the cost of material is lower, but the cost of process is becoming higher, thus the replacement of copper electrode still has barriers existed.

There are many methods for the patternization of plated metal electrodes in the present process. For example, in the laser ablation method, an antireflection layer is first coated on the silicon crystal. Then laser rays are used for bombarding the surface of the antireflection layer to vaporize the surface material of the antireflection layer and form voids. Next, electroless plating or light-induced plating (LIP) is used for forming metal electrodes in the voids of the antireflection layer.

In addition, screen-printing can be adopted. First, screen-print a metal thin layer made of patternized specific material, such as a thin silver film, on the surface of a formed antireflection layer. Afterwards, metal electrodes are formed on the silver film via LIP.

Moreover, the technology of laser firing can be used. A metal layer, such as a nickel layer, is first plated on the surface of silicon crystals. Then laser rays are used for firing specific patterns and forming nickel silicides on the fired spots of the nickel layer. Next, acid liquid is used to remove the nickel metal while keeping the portion of the formed nickel silicides.

SUMMARY

An objective of the present invention is to provide a preparation method for patternization of metal electrodes in silicon solar cells, which uses laser beams to project on the amorphous silicon material with low optical conductivity for forming polysilicon material with high optical conductivity, which enables metals to be plated during the plating process and forming metal electrodes.

Another objective of the present invention is to provide a preparation method for patternization of metal electrodes in silicon solar cells, which can control the projection path of laser beams and thus controlling the required patterns of metal electrodes with flexibility and accuracy.

Still another objective of the present invention is to provide a preparation method for patternization of metal electrodes in silicon solar cells, which requires no extra voltage difference during the plating process for enabling LIP. Instead, there is sufficient voltage difference between the plating liquid and the back electrode of silicon solar cells for precipitating metals on the electrode patterns prepared by laser beams and thus forming metal electrodes.

For achieving the objectives described above, the present invention discloses a preparation method for patternization of metal electrodes in silicon solar cells comprising the following steps. Diffuse impurities to one surface of a silicon substrate for forming a p-n junction layer on the surface of the silicon substrate. Dispose a back electrode layer on the other surface of the silicon substrate. Dispose an amorphous silicon layer on the p-n junction layer. Project a laser beam on the amorphous silicon layer for forming an electrode pattern at the spots projected by the laser beam. Immerse the solar cell in a plating liquid and forming a metal electrode on the electrode pattern. Thereby, by using the laser beam to patternize the amorphous silicon layer, the metal electrode can be formed smoothly and accurately in the plating process.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
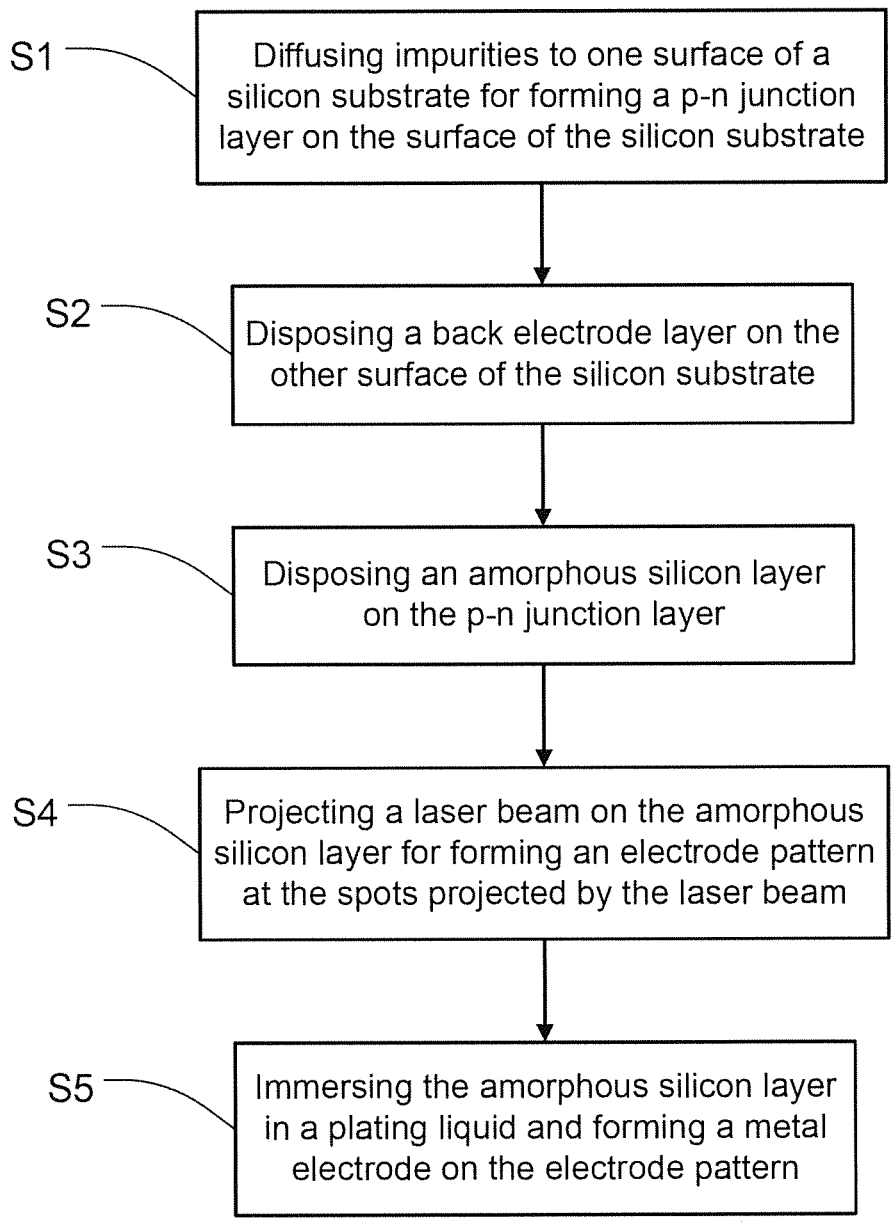
FIG. 1 shows a flowchart according to the present invention.

First, FIG. 1 shows a flowchart according to the present invention. As shown in the figure, the present invention comprises the following steps:

Step S1: Diffusing impurities to one surface of a silicon substrate for forming a p-n junction layer on the surface of the silicon substrate;

Step S2: Disposing a back electrode layer on the other surface of the silicon substrate;

Step S3: Disposing an amorphous silicon layer on the p-n junction layer;

Step S4: Projecting a laser beam on the amorphous silicon layer for forming an electrode pattern at the spots projected by the laser beam; and Step S5: Immersing the amorphous silicon layer in a plating liquid and forming a metal electrode on the electrode pattern.

Figure 2:
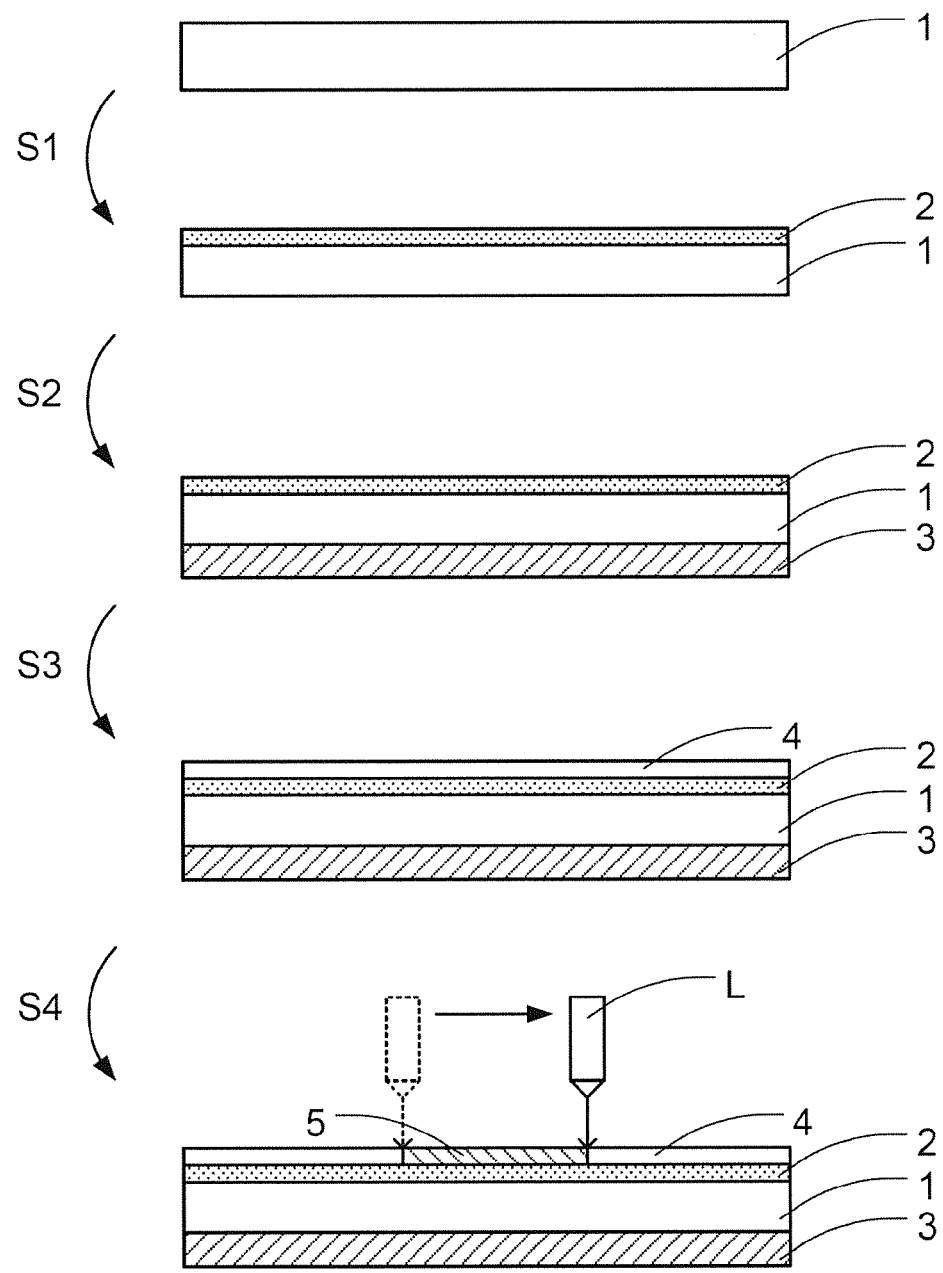
FIG. 2 shows a schematic diagram of structural changes of the steps S1~S4 according to the present invention.

Please refer to FIG. 2. In the step S1 of the present invention, a silicon substrate 1 is used as the main body of the silicon solar cells. The silicon substrate 1 could be single-crystal silicon or polysilicon. The silicon substrate 1 is prepared by general technical processes including slicing high-purity silicon ingot and cleaning; it can be applied to the solar cell field.

According to the present invention, impurities are first diffused to one surface of the silicon substrate 1 for forming a p-n junction layer 2. Here, the selected impurities differ according to the types of the silicon substrate 1. If the adopted silicon substrate 1 is p-type, phosphorus (P) is used as the impurities for diffusion and generating the p-n junction. Thereby, diffusion is performed on one surface of the silicon substrate 1 and forming the p-n junction layer 2. On the contrary, if the adopted silicon substrate 1 is n-type, boron (B) is used as the impurities for diffusion. In general, p-type silicon substrate 1 is mainly used for diffusion and forming a $p^-$-$n^+$ junction layer 2 on the silicon substrate 1.

Next, in the step S2, an electrode layer 3 is disposed on the other surface of the silicon substrate 1. Aluminum (Al) is adopted for forming aluminum electrode. Screen printing or E-gun evaporation is used for depositing aluminum to the other surface of the silicon substrate 1.

After the back electrode 3 is prepared, dispose an amorphous silicon layer 4 on the p-n junction layer 2 described above. This amorphous silicon layer 4 is composed by amorphous silicon with low optical conductivity. By using deposition, the amorphous silicon layer 4 with approximately 10 nanometers in thickness is formed on the p-n junction layer 2.

Then, because the amorphous silicon layer 4 is composed by amorphous silicon, which has extremely low optical conductivity, a laser light source L is used according to the present invention to emit a laser beam projecting on the amorphous silicon layer 4. When the excimer laser beam controlled by the laser light source L and having uniform energy contact the amorphous silicon layer 4, the amorphous structure will recrystallize after absorbing the laser energy and transform into polysilicon structure with organized structure and electrical conductivity.

When the laser light source L projects and enables the amorphous silicon of the amorphous silicon layer 4 to recrystallize into polysilicon, according to the present invention, the projected laser beam forms an electrode pattern 5 composed by polysilicon by moving the laser light source L.

Figure 3:
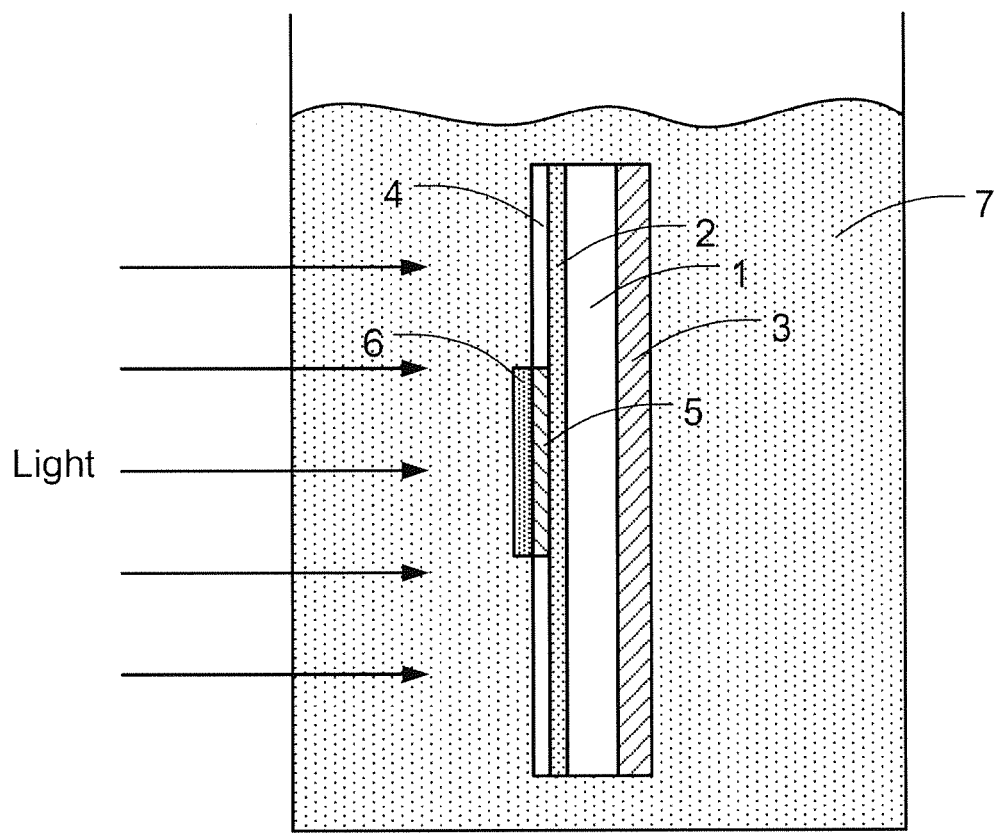
FIG. 3 shows a schematic diagram of plating in the step S5 according to the present invention.

FIG. 3 shows a schematic diagram of the process in the step S5 according to the present invention. As shown in the figure, when the amorphous silicon layer 4 having the electrode pattern 5 is immersed in the plating liquid 7, by using the plating technology, the ions of the metal to be plated, such as nickel or silver, are reduced and plated on the portion of the amorphous silicon layer 4 having high optical conductivity after illumination. Namely, the ions of the metal to be plated are reduced and plated on the electrode pattern 5 and forming the metal electrode 6 to be prepared according to the present invention.

In other words, according to the present invention, laser beams are used for recrystallize the amorphous silicon layer 4 and transforming amorphous silicon into polysilicon. The process is flexible and hence the required electrode pattern can be formed with ease. Then, in the step of immersing in the plating liquid, the required metal electrode 6 is given directly.

The plating liquid adopted by the present invention includes nickel chloride ($NiCl_2$) and boric acid. In addition, in the plating process, the light source is illuminated on the amorphous silicon layer 4 having the electrode pattern 5. By using LIP, metals are precipitated and deposited on the electrode pattern 5.

Generally speaking, the voltage difference between the p-type silicon substrate 1 and the n-type p-n junction layer 2 alone does not support the formation of the metal electrode 6 with sufficient thickness on the electrode pattern 5. Thereby, for general LIP, an external voltage is required at the back electrode layer 3. By supplying the external voltage in series with the p-n junction, a sufficient voltage difference is provided for undergoing LIP. Nonetheless, according to the present invention, no external voltage is required. Instead, the voltage difference across the interface between the back electrode layer 3 and the plating liquid 7 facilitates smooth process of LIP. The voltage difference across the interface between the selected plating liquid according to the present invention and the back electrode layer 3 is greater than 0.88 volts. Consequently, as the amorphous silicon layer 4 having the electrode pattern 5 is immersed in the plating liquid 7 without external voltage, the metal electrode 6 can be formed directly. If the difference between the Fermi levels of the plating liquid 7 and the back electrode layer 3 is excessively small and making the voltage difference across the interface excessively small accordingly, without external voltage, it is difficult to form the metal electrode 6 or the formed metal electrode 6 is too thin to be used.

According to the steps of the present invention disclosed above, patternization is processed on the amorphous silicon layer in advanced by taking advantages of high precision and rapid effect of laser. Then, after immersing the solar cell in the plating liquid, the metal electrode can be formed accurately at the spots of the amorphous silicon layer patterned by laser light. No external voltage is required; plating is induced by illumination directly. Thereby, with the advantages of reduced costs of the material and process of the metal electrode as well as improved quality, the present invention undoubtedly provides a practical preparation method for patternization of metal electrodes in silicon solar cells.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A preparation method for patternization of metal electrodes in silicon solar cells, comprising steps of:

diffusing impurities to one surface of a silicon substrate for forming a p-n junction layer on the surface of said silicon substrate;

disposing a back electrode layer on the other surface of said silicon substrate;

disposing an amorphous silicon layer on said p-n junction layer;

projecting a laser beam on said amorphous silicon layer for forming an electrode pattern at the spots projected by said laser beam; and immersing said amorphous silicon layer in a plating liquid and forming a metal electrode on said electrode pattern.

2. The preparation method of claim 1, wherein screen printing or E-gun evaporation is adopted in said step of disposing said back electrode layer on the other surface of said silicon substrate.

3. The preparation method of claim 1, wherein said impurities are selected form the group consisting of phosphorus and boron.

4. The preparation method of claim 1, wherein said plating liquid contains nickel chloride and boric acid.

5. The preparation method of claim 1, wherein said the voltage difference across the interface between said plating liquid and said back electrode layer is greater than 0.88 volts.

6. The preparation method of claim 1, wherein the material of said back electrode is aluminum.

7. The preparation method of claim 1, wherein said amorphous silicon layer is illuminated and forming said metal electrode on said electrode pattern in said step of immersing said amorphous silicon layer in said plating liquid and forming said metal electrode on said electrode pattern.

* * * * *